(12) United States Patent  (10) Patent No.: US 12,302,531 B2
Chung et al.  (45) Date of Patent: May 13, 2025

(54) HANDHELD ELECTRONIC DEVICE

(71) Applicant: ASUSTEK COMPUTER INC., Taipei (TW)

(72) Inventors: Chien-Feng Chung, Taipei (TW); Ching-Yuan Yang, Taipei (TW); Chih-Yao Kuo, Taipei (TW); Cheng-Han Chung, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 208 days.

(21) Appl. No.: 18/175,168

(22) Filed: Feb. 27, 2023

(65) Prior Publication Data
US 2024/0064938 A1  Feb. 22, 2024

(30) Foreign Application Priority Data
Aug. 22, 2022 (TW) ................................ 111131518

(51) Int. Cl.
H05K 7/20 (2006.01)
G06F 1/16 (2006.01)
(Continued)

(52) U.S. Cl.
CPC ....... H05K 7/20336 (2013.01); G06F 1/1656 (2013.01); G06F 1/203 (2013.01);
(Continued)

(58) Field of Classification Search
CPC ........ G06F 1/20; G06F 1/1601; G06F 1/1643; G06F 1/1656; G06F 1/203; G06F 1/206; G06F 2200/201; H05K 9/0007; H05K 7/2039; H05K 7/20336; H05K 9/0024; H05K 9/0032; H05K 7/20509; H05K 7/20963; H05K 1/0203; H05K 1/189; H05K 7/20154; H05K 7/205; H05K 7/20436; H05K 7/20409; H05K 7/20; H04M 1/026; H04M 1/0277; H04M 1/0202;
(Continued)

(56) References Cited

U.S. PATENT DOCUMENTS 9,151,978 B2 * 10/2015 Tsurusaki ............ G02F 1/13338
9,405,335 B1 * 8/2016 Boilard .................... G06F 1/20
(Continued)

FOREIGN PATENT DOCUMENTS

CN 207266119 U 4/2018
CN 110058667 A 7/2019
(Continued)

Primary Examiner — Michael A Matey
(74) Attorney, Agent, or Firm — MUNCY, GEISSLER, OLDS & LOWE. P.C

(57) ABSTRACT

A handheld electronic device is provided. The handheld electronic device includes a screen, a back cover, a frame, a main board, and a heat conduction structure. The frame is arranged between the screen and the back cover. The frame and the back cover define a space. The main board is arranged in the space, and includes a front surface and a back surface. The front surface faces the screen and includes a heat source. The heat conduction structure extends from the front surface to the back surface, and includes a first end and a second end opposite to each other. The first end is arranged at the heat source, and the second end extends to the back cover.

10 Claims, 7 Drawing Sheets

(51) Int. Cl.
*G06F 1/20* (2006.01)
*H05K 9/00* (2006.01)
(52) U.S. Cl.
CPC ............ *G06F 1/206* (2013.01); *H05K 7/2039* (2013.01); *H05K 9/0007* (2013.01)
(58) Field of Classification Search
CPC ............ H04M 1/0266; H04M 2201/38; G02F 1/133628; H01L 23/427; H01L 33/64; F28D 15/0233; F28D 15/0275; F28D 1/02; F28D 2021/0029
See application file for complete search history.

(56) References Cited

U.S. PATENT DOCUMENTS

| | | | | |
|---|---|---|---|---|
| 9,411,385 | B2* | 8/2016 | Pierce | G06F 1/1658 |
| 10,241,549 | B2* | 3/2019 | Uto | G06F 3/0443 |
| 10,551,886 | B1* | 2/2020 | de la Fuente | H05K 7/20963 |
| 2004/0032710 | A1* | 2/2004 | Fujiwara | G06F 1/1616 |
| 2010/0066939 | A1* | 3/2010 | Ohashi | G02B 6/0085 |
| | | | | 349/58 |
| 2014/0139978 | A1* | 5/2014 | Kwong | C30B 29/20 |
| | | | | 361/679.01 |
| 2015/0055300 | A1 | 2/2015 | Hsieh et al. | |
| 2015/0062456 | A1* | 3/2015 | Miyazaki | G06F 3/04164 |
| | | | | 349/12 |
| 2015/0083371 | A1* | 3/2015 | Hsieh | G06F 1/20 |
| | | | | 165/185 |
| 2015/0253612 | A1* | 9/2015 | Hasegawa | G02F 1/133308 |
| | | | | 349/58 |
| 2015/0301568 | A1* | 10/2015 | Hill | G06F 1/20 |
| | | | | 29/890.03 |
| 2016/0183414 | A1* | 6/2016 | Huang | H01L 23/373 |
| | | | | 361/709 |
| 2017/0083061 | A1* | 3/2017 | Stellman | H01L 23/467 |
| 2018/0035528 | A1* | 2/2018 | Kim | H05K 9/0033 |
| 2018/0235073 | A1* | 8/2018 | Ma | H05K 7/2039 |
| 2018/0284855 | A1* | 10/2018 | North | G06F 1/203 |
| 2019/0041922 | A1* | 2/2019 | Kurma Raju | H05K 7/2039 |
| 2019/0364695 | A1* | 11/2019 | Lee | H05K 7/20336 |
| 2020/0136243 | A1* | 4/2020 | Shin | H04M 1/026 |
| 2020/0356143 | A1* | 11/2020 | Oh | G06F 1/1616 |
| 2021/0259136 | A1* | 8/2021 | Sawayama | H01L 23/36 |
| 2022/0312633 | A1* | 9/2022 | Zhang | H05K 7/20163 |
| 2022/0317363 | A1* | 10/2022 | Zhou | G02F 1/133628 |
| 2022/0394874 | A1* | 12/2022 | Masuda | H01Q 1/02 |
| 2023/0224389 | A1* | 7/2023 | Hill | H04M 1/0266 |
| | | | | 455/556.1 |

FOREIGN PATENT DOCUMENTS

| | | |
|---|---|---|
| CN | 216357908 U | 4/2022 |
| TW | I609621 B | 12/2017 |

* cited by examiner

HANDHELD ELECTRONIC DEVICE

CROSS-REFERENCE TO RELATED APPLICATION

This application claims the priority benefit of Taiwan application serial No. 111131518, filed on Aug. 22, 2022. The entirety of the above-mentioned patent application is hereby incorporated by reference herein and made a part of the specification.

BACKGROUND OF THE INVENTION

Field of the Invention

The disclosure relates to a handheld electronic device, and particularly, to a handheld electronic device with a heat conduction structure.

Description of the Related Art

The existing heat dissipation methods for mobile phones are mainly using contact between a plurality of heat dissipation elements to transfer heat generated by the main board to the metal frame of the mobile phone for heat dissipation. The heat dissipation path of this heat dissipation method is undiversified. In addition, the heat dissipation path includes a plurality of elements, and has relatively high heat transfer resistance and relatively poor heat dissipation efficiency, which prevents the performance designs of the mobile phones from being be improved.

BRIEF SUMMARY OF THE INVENTION

The disclosure provides a handheld electronic device. The handheld electronic device includes a screen, a back cover, a frame, a main board, and a heat conduction structure. The frame is arranged between the screen and the back cover. The frame and the back cover define a space. The main board is arranged in the space, and includes a front surface and a back surface. The front surface faces the screen and includes a heat source. The heat conduction structure extends from the front surface to the back surface, and includes a first end and a second end opposite to each other. The first end is arranged at the heat source, and the second end extends to the back cover.

The handheld electronic device provided by the disclosure utilizes the heat conduction structure to efficiently transfer heat generated by the heat source to the back cover, so as to improve the heat dissipation efficiency of the handheld electronic device and alleviate the problem that the heat dissipation efficiency prevents the designed performance of the conventional handheld electronic device from being improved.

DETAILED DESCRIPTION OF THE EMBODIMENTS

More detailed descriptions of specific embodiments of the disclosure are provided below with reference to the schematic diagrams. The features and advantages of the disclosure are described more clearly according to the following description and claims. It should be noted that all of the drawings use very simplified forms and imprecise proportions, only being used for assisting in conveniently and clearly explaining the objective of the embodiments of the disclosure.

Figure 1:
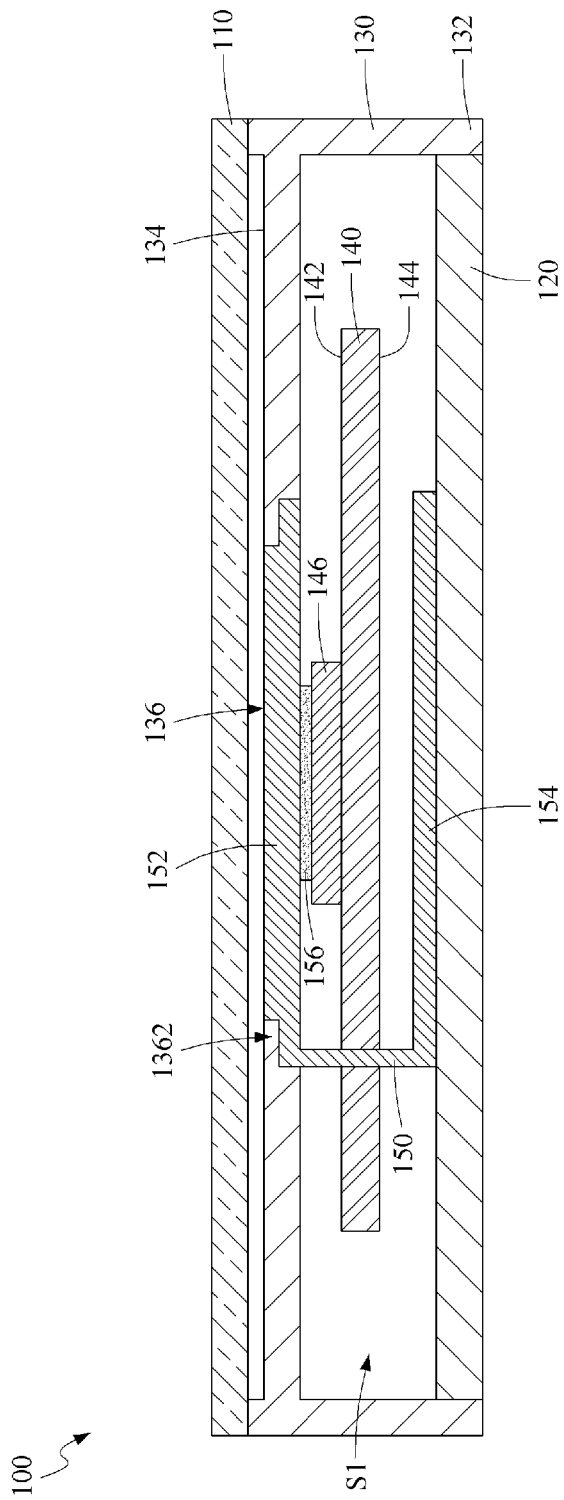
FIG. 1 is a schematic cross-sectional view of a handheld electronic device according to a first embodiment of the disclosure.

FIG. 1 is a schematic cross-sectional view of a handheld electronic device 100 according to a first embodiment of the disclosure. The handheld electronic device 100, for example, is a tablet computer or a smartphone.

As shown in the figure, the handheld electronic device 100 includes a screen 110, a back cover 120, a frame 130, a main board 140, and a heat conduction structure 150.

The frame 130 is arranged between the screen 110 and the back cover 120. The frame 130 includes a side wall 132 and a supporting portion 134. The supporting portion 134 extends inward from the side wall 132. The screen 110 is arranged in front of the supporting portion 134.

The back cover 120 is arranged behind the supporting portion 134, and the frame 130 and the back cover 120 defines a space Si. The supporting portion 134 of the frame 130 further includes a first opening 136. In an embodiment, the frame 130 is made of a metal material, to provide a better heat conduction effect.

The main board 140 is arranged in the space Si defined by the back cover 120 and the frame 130, and includes a front surface 142 and a back surface 144. The front surface 142 faces the screen 110 and includes a heat source 146.

In an embodiment, the heat source 146 is a chip, for example, a central processing unit (CPU) or a graphics processing unit (GPU).

The heat conduction structure 150 extends from the front surface 142 of the main board 140 to the back surface 144, and includes a first end 152 and a second end 154 opposite to each other. A side of the first end 152 of the heat conduction structure 150 facing the main board 140 is arranged at the heat source 146, and the first end 152 is embedded into the first opening 136 of the frame 130, to help reduce the overall thickness of the handheld electronic device 100.

In an embodiment, the first end 152 is fixed to a surface of the heat source 146 through a heat conduction glue layer 156. The second end 154 of the heat conduction structure 150 extends to the back cover 120.

In an embodiment, the second end 154 of the heat conduction structure 150 is in direct contact with an inner side surface of the back cover 120, but is not limited thereto. In other embodiments, the second end 154 of the heat conduction structure 150 is also in indirect contact with the inner side surface of the back cover 120 through a heat conduction glue layer.

In this way, in addition to being transferred by the first end 152 of the heat conduction structure 150 in a contact manner to the frame 130 to be discharged to the outside, heat generated by the heat source 146 is also conducted to the second end 154 from the first end 152 of the heat conduction structure 150, and then, is transferred to the back cover 120 in a contact manner to be discharged to the outside. Through the two heat conduction paths, the overall heat dissipation efficiency of the handheld electronic device 100 is improved.

In an embodiment, the heat conduction structure 150 extends from the front surface 142 of the main board 140 through an opening on the main board 140 to the back surface 144, but is not limited thereto. In other embodiments, the heat conduction structure 150 extends from the front surface 142 of the main board 140, bypasses a side edge of the main board 140, and then extends to the back surface 144 of the main board 140.

In an embodiment, the first end 152 and the second end 154 of the heat conduction structure 150 both present flat structures, to increase the contact area and reduce thermal resistance while avoiding disadvantageous impact on the overall thickness of the handheld electronic device 100.

In an embodiment, the heat conduction structure 150 is a heat pipe structure. In an embodiment, the heat conduction structure 150 is a vapor chamber (VC) structure, but is not limited thereto. Other heat conduction structures made of high heat-transfer materials are also applicable to the disclosure.

In an embodiment, a side edge of the first opening 136 of the frame 130 includes a stepped structure 1362. The stepped structure 1362 helps locate the first end 152 of the heat conduction structure 150 into the first opening 136.

Figure 2:
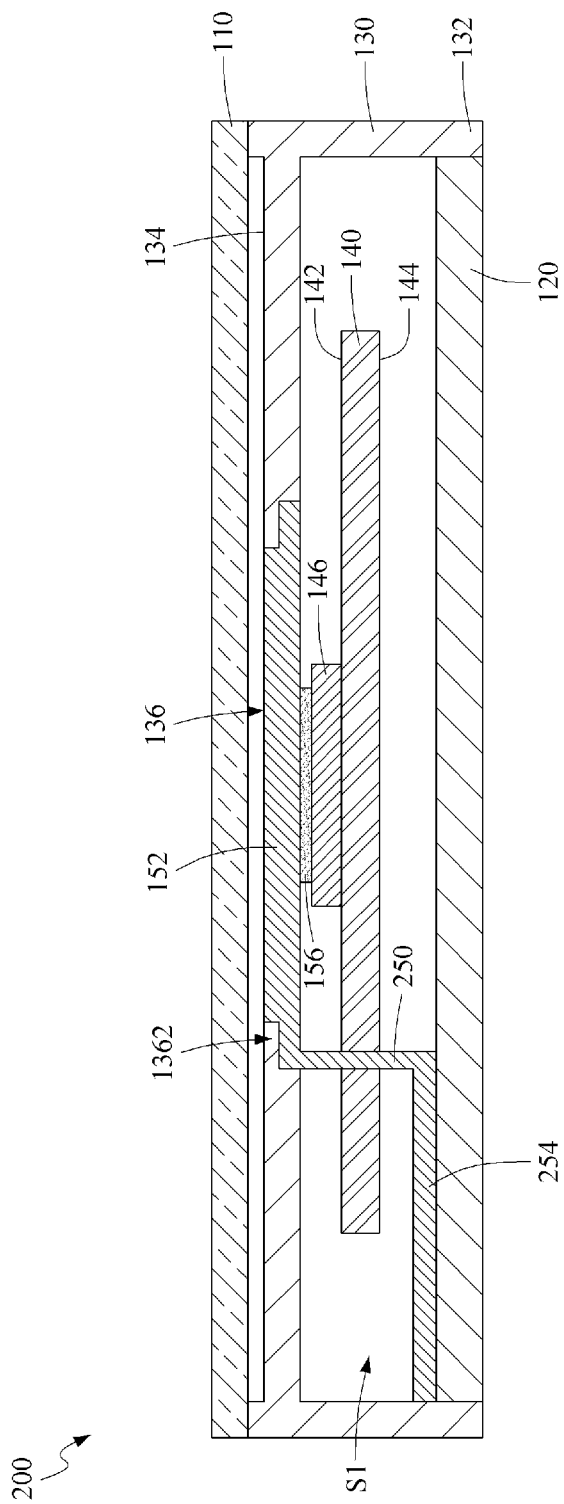
FIG. 2 is a schematic cross-sectional view of a handheld electronic device according to a second embodiment of the disclosure.

FIG. 2 is a schematic cross-sectional view of a handheld electronic device 200 according to a second embodiment of the disclosure.

Compared with the embodiment of FIG. 1, in which the heat conduction structure 150 presents a U-shaped structure, and the second end 154 thereof is approximately located at a central position of the back cover 120, a heat conduction structure 250 of this embodiment presents an S-shaped structure, and a second end 254 thereof is located at an edge position of the back cover 120. Such a design helps keep more space between the main board 140 and the back cover 120 to accommodate a battery or other electronic elements.

Figure 3:
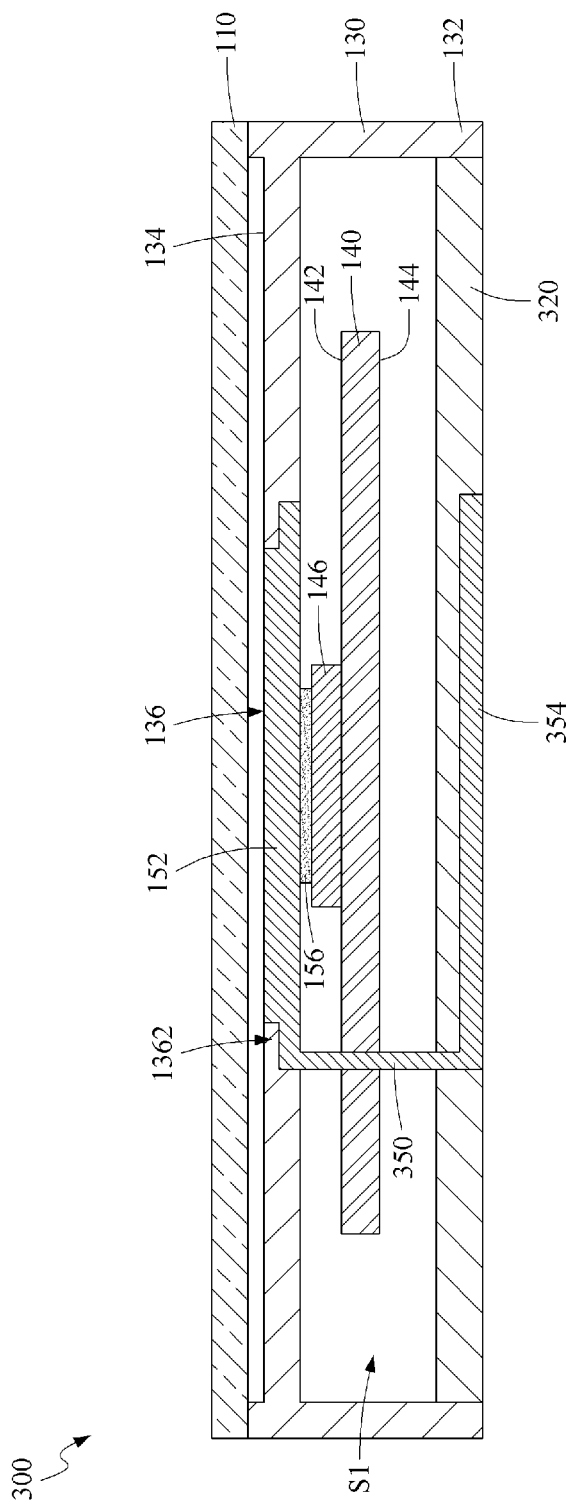
FIG. 3 is a schematic cross-sectional view of a handheld electronic device according to a third embodiment of the disclosure.

FIG. 3 is a schematic cross-sectional view of a handheld electronic device 300 according to a third embodiment of the disclosure.

Compared with the embodiment of FIG. 1, in which the second end 154 of the heat conduction structure 150 is arranged on the inner side surface of the back cover 120, a second end 354 of a heat conduction structure 350 of this embodiment is embedded into a back cover 320, which helps reduce the overall thickness of the handheld electronic device 300.

In an embodiment, the second end 354 of the heat conduction structure 350 extends to an outer side of the back cover 320, to directly expose an outer side of the second end 354 to the outside, to improve the heat dissipation efficiency of the heat conduction structure 350.

Figure 4:
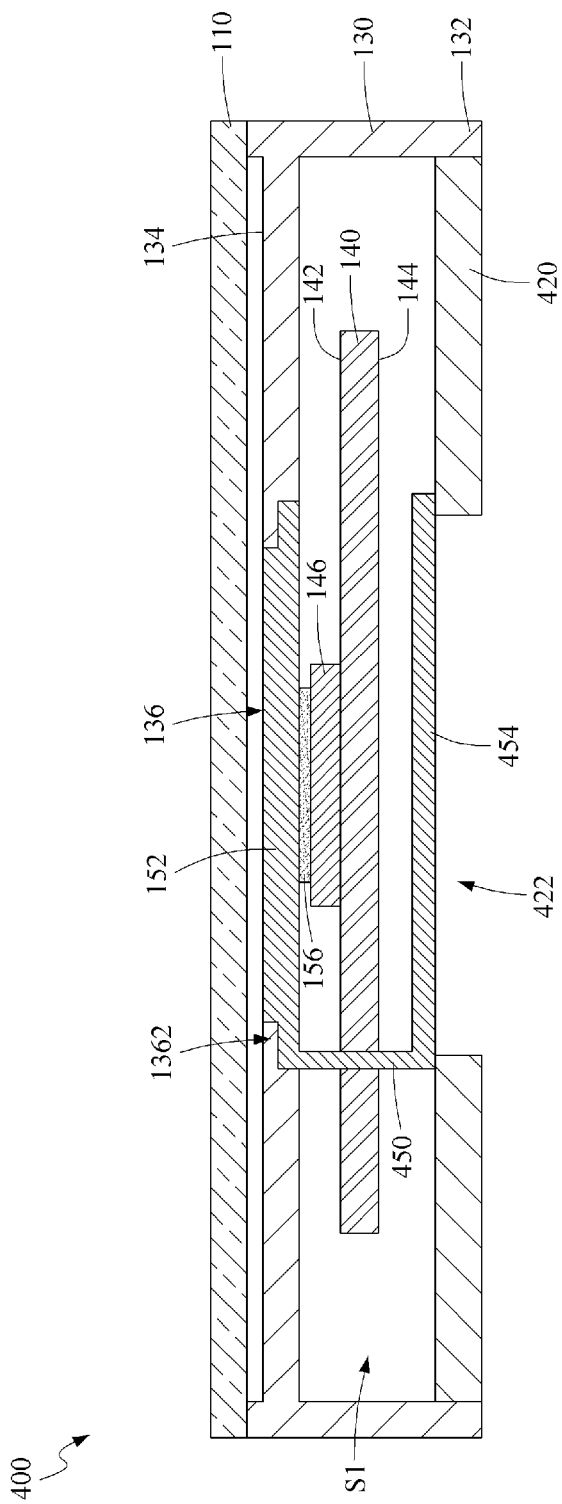
FIG. 4 is a schematic cross-sectional view of a handheld electronic device according to a fourth embodiment of the disclosure.

FIG. 4 is a schematic cross-sectional view of a handheld electronic device 400 according to a fourth embodiment of the disclosure.

Compared with the embodiment of FIG. 1, in which the back cover 120 isolates the heat conduction structure 150 from the outside, a back cover 420 of this embodiment includes a heat dissipation hole 422. A second end 454 of a heat conduction structure 450 is exposed by the heat dissipation hole 422 to the outside.

With the help of the heat dissipation hole 422, in addition to being discharged to the outside through the back cover 420 in a contact manner, heat transferred by the heat source 146 to the heat conduction structure 450 is also directly discharged to the outside by the second end 454 of the heat conduction structure 450 through the heat dissipation hole 422. In this way, the overall heat dissipation efficiency of the handheld electronic device 400 is improved.

In an embodiment, the second end 454 of the heat conduction structure 450 completely covers the heat dissipation hole 422, to prevent environmental dust and particles from entering into the handheld electronic device 300 and further exerting impact on the internal electronic elements.

In this embodiment, only a single heat dissipation hole 422 is presented on the back cover 420, but the disclosure is not limited thereto. In other embodiments, the back cover 420 includes a heat dissipation region. The heat dissipation region includes a plurality of heat dissipation holes 422 inside. The second end 454 the heat conduction structure 450 directly discharge heat to the outside through the heat dissipation holes 422.

Figure 5:
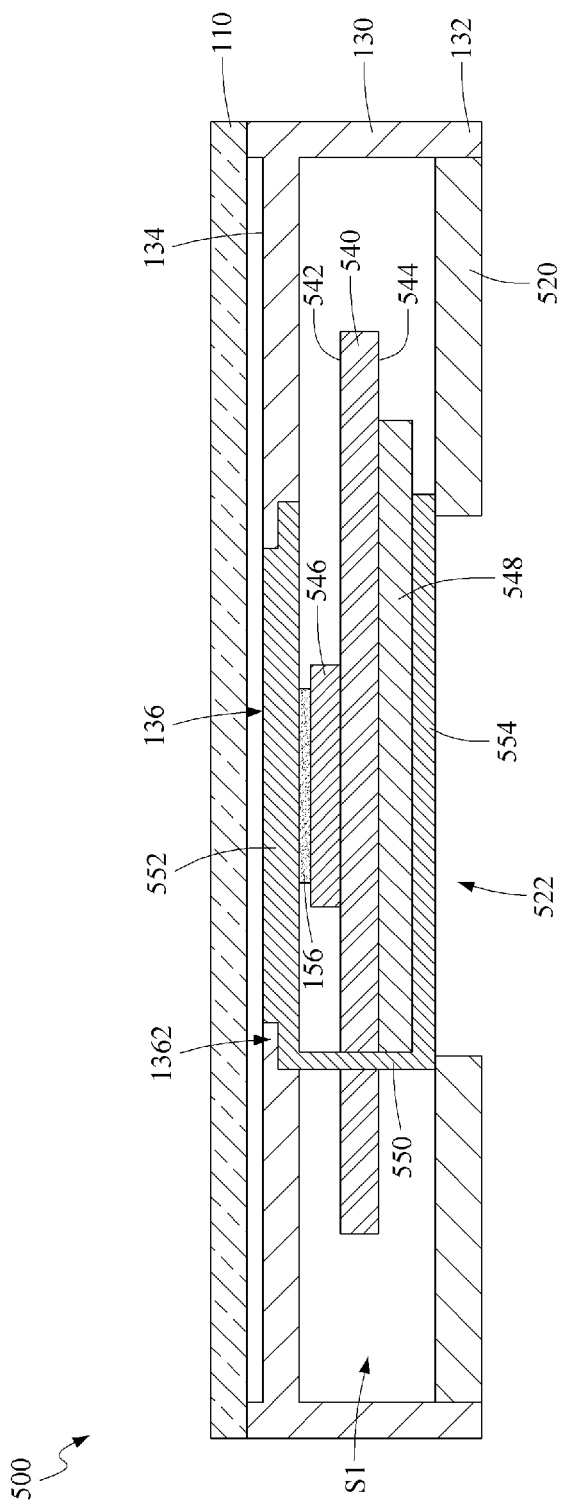
FIG. 5 is a schematic cross-sectional view of a handheld electronic device according to a fifth embodiment of the disclosure.

FIG. 5 is a schematic cross-sectional view of a handheld electronic device 500 according to a fifth embodiment of the disclosure.

Compared with the embodiment of FIG. 4, a back surface 544 of a main board 540 of this embodiment includes an electromagnetic shielding structure 548, configured to shield a radio frequency (RF) baseband (BB) chip, to avoid impact on other elements on the main board 540.

A second end 554 of a heat conduction structure 550 is located between the electromagnetic shielding structure 548 and a back cover 520, and two opposite surfaces of the second end 554 are respectively arranged on the electromagnetic shielding structure 548 and the back cover 520, which helps discharge heat generated by the main board 540 through the back cover 520 and a heat dissipation hole 522 on the back cover 520.

The heat conduction structure 550 of this embodiment provides three different heat dissipation paths for the main board 540. One is that a heat source 546 on a front surface 542 of the main board 540 discharge heat to the outside through a first end 552 of the heat conduction structure 550 and the frame. One is that the heat source 546 on the front surface 542 of the main board 540 transfers heat to the second end 554 through the first end 552 of the heat conduction structure 550, and then, the heat is discharged to the outside through the back cover 520 and the heat dissipation hole 522 on the back cover 520. The other one is that the electromagnetic shielding structure 548 of the back surface 544 of the main board 540 transfers heat to the back cover 520 through the second end 554 of the heat conduction structure 550, and then, the heat is discharged to the outside through the back cover 520 and the heat dissipation hole 522 on the back cover 520. In this way, the overall heat dissipation efficiency of the handheld electronic device 500 is improved.

Figure 6A:
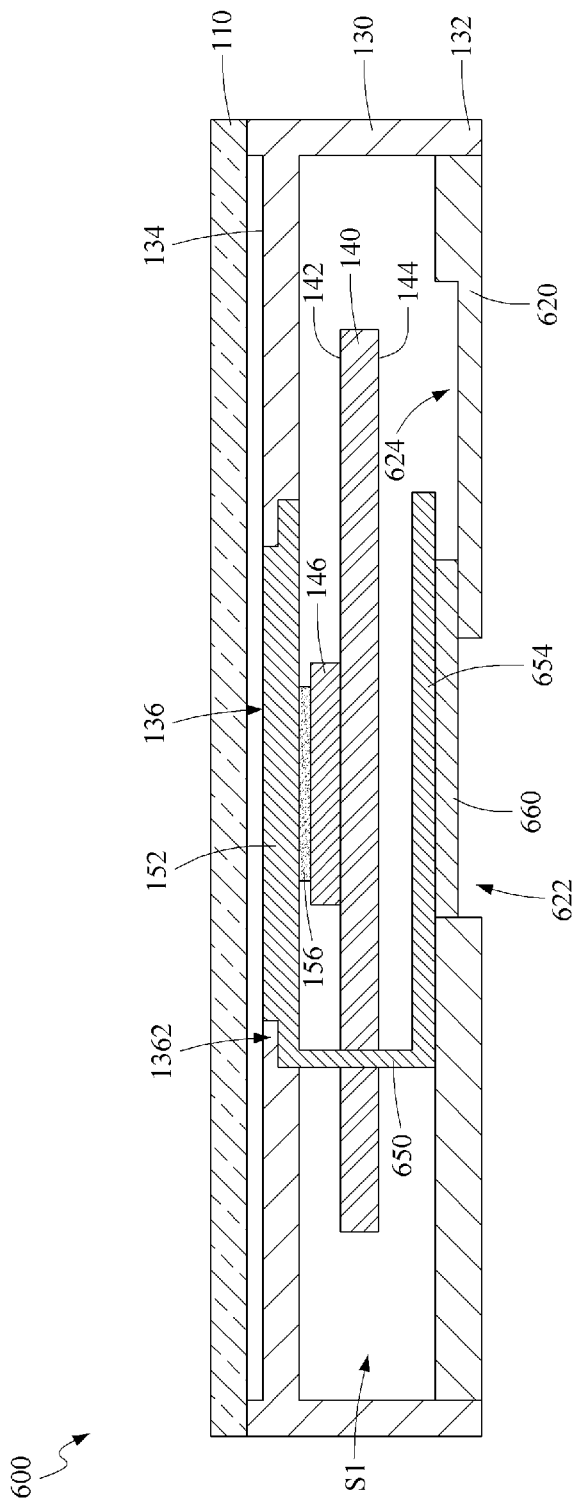
FIG. 6A and FIG. 6B are schematic cross-sectional views of a handheld electronic device according to a sixth embodiment of the disclosure.
Figure 6B:
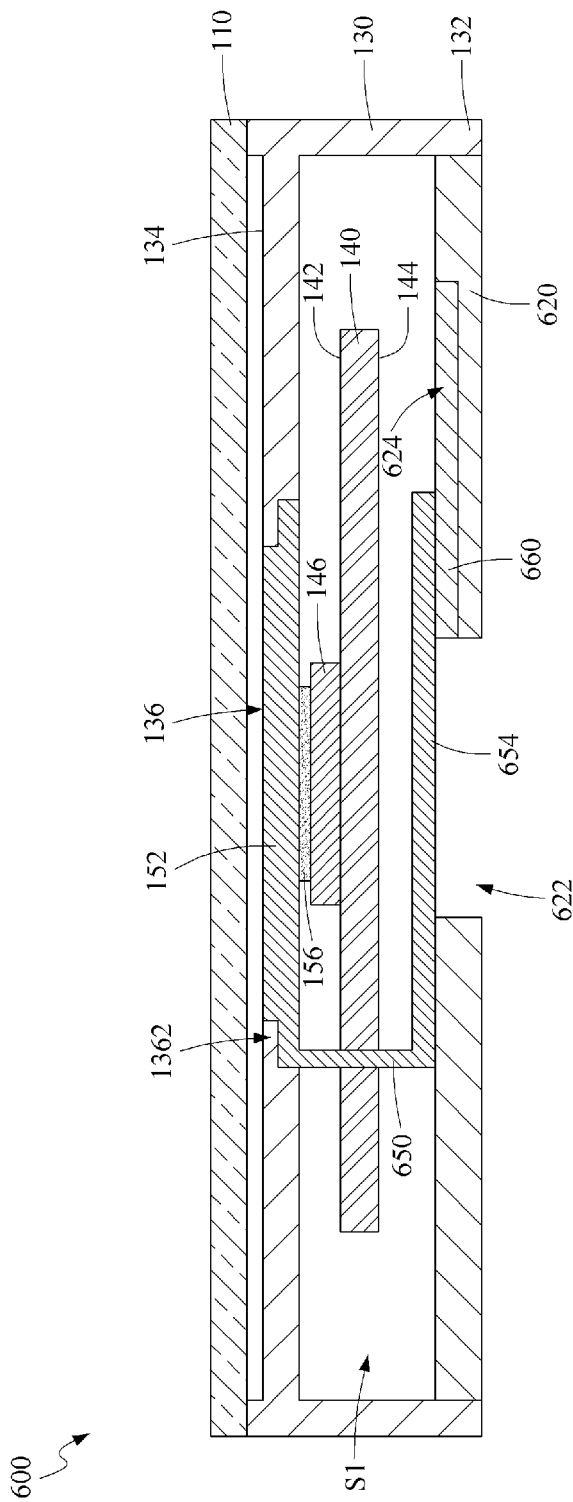

FIG. 6A and FIG. 6B are schematic cross-sectional views of a handheld electronic device 600 according to a sixth embodiment of the disclosure.

Compared with the embodiment of FIG. 4, a handheld electronic device 600 of this embodiment includes a cover plate 660, configured to selectively shield a heat dissipation hole 622 on a back cover 620. In an embodiment, as shown in the figure, the back cover 620 includes a slide groove 624. The cover plate 660 is slidably arranged on an inner side surface of the back cover 620, configured to selectively shield the heat dissipation hole 622, but the disclosure is not limited thereto.

For example, the cover plate 660 is pivotally connected to a side edge of the heat dissipation hole 622. The cover plate 660 is rotated to selectively shield the heat dissipation hole 622. The cover plate 660 is slidably connected to the back surface of the main board through a slide mechanism, for example, a slide groove. Alternatively, the cover plate 660 is slidably connected to the frame through a slide mechanism, for example, a slide groove.

In this way, by controlling a position of the cover plate 660, a user opens the heat dissipation hole 622 on the back cover 620 when needing to improve the heat dissipation efficiency, to discharge heat from the second end 654 of the heat conduction structure 650 to the outside through the heat dissipation hole 622. Moreover, during normal operation, the heat dissipation hole 622 is shielded by the cover plate 660, to prevent environmental dust and particles from entering into the handheld electronic device 600 and further exerting impact on the internal electronic elements.

The handheld electronic device 100, 200, 300, 400, 500, 600 provided by the disclosure utilizes the heat conduction structure 150, 250, 350, 450, 550, 650 to efficiently transfer heat generated by the heat source 146, 546 to the back cover 120, 320, 420, 520, 620, so as to improve the heat dissipation efficiency of the handheld electronic device 100, 200, 300, 400, 500, 600 and alleviate the problem that the heat dissipation efficiency prevents the designed performance of the conventional handheld electronic device from being improved.

The above are only exemplary embodiments of the disclosure and are not intended to limit the disclosure in any way. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A handheld electronic device, comprising:
   a screen;
   a back cover;
   a frame, arranged between the screen and the back cover, wherein the frame and the back cover define a space;
   a main board, arranged in the space, and comprising a front surface and a back surface, wherein the front surface faces the screen, and the front surface comprises a heat source; and
   a heat conduction structure, extending from the front surface to the back surface, and comprising a first end and a second end opposite to each other, wherein the first end is arranged at the heat source, and the second end extends to the back cover,
   wherein the frame comprises a side wall and a supporting portion, the supporting portion extends inward from the side wall, the supporting portion comprises a first opening, and the first end is embedded into the first opening.

2. The handheld electronic device according to claim 1, wherein the heat conduction structure is a heat pipe structure.

3. The handheld electronic device according to claim 1, wherein the heat conduction structure is a vapor chamber (VC) structure.

4. The handheld electronic device according to claim 1, wherein the heat conduction structure presents a U-shaped structure or an S-shaped structure.

5. The handheld electronic device according to claim 1, wherein a side edge of the first opening comprises a stepped structure.

6. The handheld electronic device according to claim 1, wherein the back cover comprises a heat dissipation hole, and the second end is exposed to the outside through the heat dissipation hole.

7. The handheld electronic device according to claim 6, further comprising a cover plate, disposed on the back cover or the back surface of the main board, and configured to selectively shield the heat dissipation hole.

8. The handheld electronic device according to claim 1, wherein the heat source is a central processing unit.

9. The handheld electronic device according to claim 1, wherein the back surface comprises an electromagnetic shielding structure, and the second end is disposed on the electromagnetic shielding structure.

10. The handheld electronic device according to claim 9, wherein the second end is located between the electromagnetic shielding structure and the back cover.

* * * * *